United States Patent
Slavin

[19]

[11] Patent Number: 5,910,908
[45] Date of Patent: Jun. 8, 1999

[54] FIR FILTER FOR PROGRAMMABLE DECIMATION

[75] Inventor: Keith R. Slavin, Beaverton, Oreg.

[73] Assignee: Tektronix, Inc., Wilsonville, Oreg.

[21] Appl. No.: 08/931,408

[22] Filed: Sep. 16, 1997

[51] Int. Cl.[6] .................................................. G06F 17/10
[52] U.S. Cl. .......................................................... 364/724.1
[58] Field of Search .......................................... 364/724.1

[56] References Cited

U.S. PATENT DOCUMENTS

| | | | |
|---|---|---|---|
| 5,157,395 | 10/1992 | Signore et al. | 364/724.1 |
| 5,191,547 | 3/1993 | Kawamoto et al. | 364/724.1 |
| 5,453,741 | 9/1995 | Iwata | 364/724.1 |
| 5,548,540 | 8/1996 | Staver et al. | 364/724.1 |
| 5,717,617 | 2/1998 | Chester | 364/724.1 |
| 5,751,615 | 5/1998 | Brown | 364/724.1 |

*Primary Examiner*—David H. Malzahn
*Attorney, Agent, or Firm*—Francis I. Gray

[57] ABSTRACT

A FIR filter for programmable decimation by powers of two has an input coupled to receive an input signal and an output coupled to the input. The FIR filter uses context registers, where the number of contexts per context register is equal to the maximum desired decimation power m. An output context register coupled to provide the output simultaneously contains all of the decimation output results, the desired decimation result being selected as one of the output contexts. A cascade of timing circuits in response to an initial clock signal and an initial valid signal at one-half the frequency of the initial clock signal provide timing signals for storing the decimation results as separate contexts in each context register. At any time any desired decimation result is available for output.

5 Claims, 3 Drawing Sheets

FIR FILTER FOR PROGRAMMABLE DECIMATION

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

The present invention relates to finite impulse response (FIR) filters, and more particularly to a FIR filter for programmable decimation by powers of two.

A decimate-by-two FIR filter has the following ideal characteristics:

$$A(\omega) \approx 1 \quad 0 \leq \omega \leq \Pi/4 \quad (1)$$
$$0 \leq A(\omega) \leq 1 \quad \Pi/4 < \omega < \Pi/2 \quad (2)$$
$$A(\omega) \approx 0 \quad \Pi/2 \leq \omega \leq \Pi \quad (3)$$

In practice a Parks-McClellan equi-ripple design algorithm, using the Remez exchange algorithm with Chebyshev design theory, has a smooth and monotonic response in the transition region of Equation (2). With this response every other output from the filter may be discarded without aliasing problems, and the transition band becomes the rejected band for any following decimation stage, allowing for cascading. Therefore decimation by $2^m$ may be performed with m filter stages coupled in series. Such a direct approach to decimating by $2^m$ where m is large results in a huge amount of hardware. Furthermore later decimation stages have lower structural usage, defined as operations per gate per clock event.

What is desired is a FIR filter for programmable decimation by powers of two that reduces the amount of hardware required while maximizing the operations per gate per clock event.

SUMMARY OF THE INVENTION

Accordingly the present invention provides a FIR filter for programmable decimation by powers of two that uses context registers with the output from the filter being fed back to the input. An input signal is sampled at one-half an input clock rate and progressively decimated, with each decimation result stored in a separate register within each context register. An output context register contains the result for each level of decimation by two, and the desired decimation output is selected for output according to a selected output signal. A cascade of timing circuits provide appropriate timing signals for the FIR filter, one timing circuit for each level of decimation corresponding to the number of separate registers in each context register. In this way any decimation is available for output, and multiple devices may access the FIR filter to get different decimation factors for the same input signal.

The objects, advantages and other novel features of the present invention are apparent from the following detailed description when read in conjunction with the appended claims and attached drawing.

DESCRIPTION OF THE SEVERAL VIEWS OF THE DRAWING

FIG. 3 is a block diagram view of a representative timing circuit for the FIR filter of FIG. 2.

DETAILED DESCRIPTION OF THE INVENTION

The following precepts are the basis for the FIR filter design for programmable decimation by powers of two:

1. The data rate in and out of a filter may be less than the system clock by the use of input and output valid signals that control register state changes within the design. Such state changes may be implemented with synchronous input-enable registers, allowing fully synchronous designs.

2. For a decimating filter the output data rate is half the input rate.

3. For any finite integer m this geometric sum is known:

$$\Sigma_{i=1 \to m}(½^i)=1-(½^m)<1 \quad (4)$$

4. The present and new state of any register-oriented hardware system depends only upon the state of its registers and inputs, analogous to "contexts" in software.

If the FIR filter is designed to receive an initial input rate of $f_s/2$ where $f_s$ is the clock rate, then the output rate is $f_s/4$ which is the input rate for the next filter, etc. Now the above equation gives the sum of the input rates, $f_s/2+f_s/4+f_s/8$ . . ., for m such filters as less than $f_s$ so the entire bandwidth of all the inputs to all m filters fits within the clock rate $f_s$ for any number of decimation stages m.

Every register within a filter design is replaced with an m-register file to allow m filter contexts, and control of the input of the filter comes from either the external input stream at $f_s/2$ or less or from the output of the filter in its previous context, in both cases with the data-valid from the appropriate source or context, such that only the first decimation context receives data from the filter system input. Such a filter decimates by any factor up to $2^m$ merely by marking which output valid context to send out from the filter system. Indeed such a design decimates by any power of two up to $2^m$ simultaneously by generating separate valid signals marking the required data for each system receiving the filter output stream.

This approach is more hardware economical than cascading decimating filters because only the registers are duplicated m times, not the logic between them which includes multipliers and adders. This results in a hardware saving of about a factor of two. The constraint on using arbitrarily large values of m is the amount of register storage required for m contexts. Another advantage is that changing the decimation factors is merely a matter of generating proper valid signals, so the filter coefficients may be fixed, such as by using shift-add structures, allowing for even more economical designs.

Figure 1:
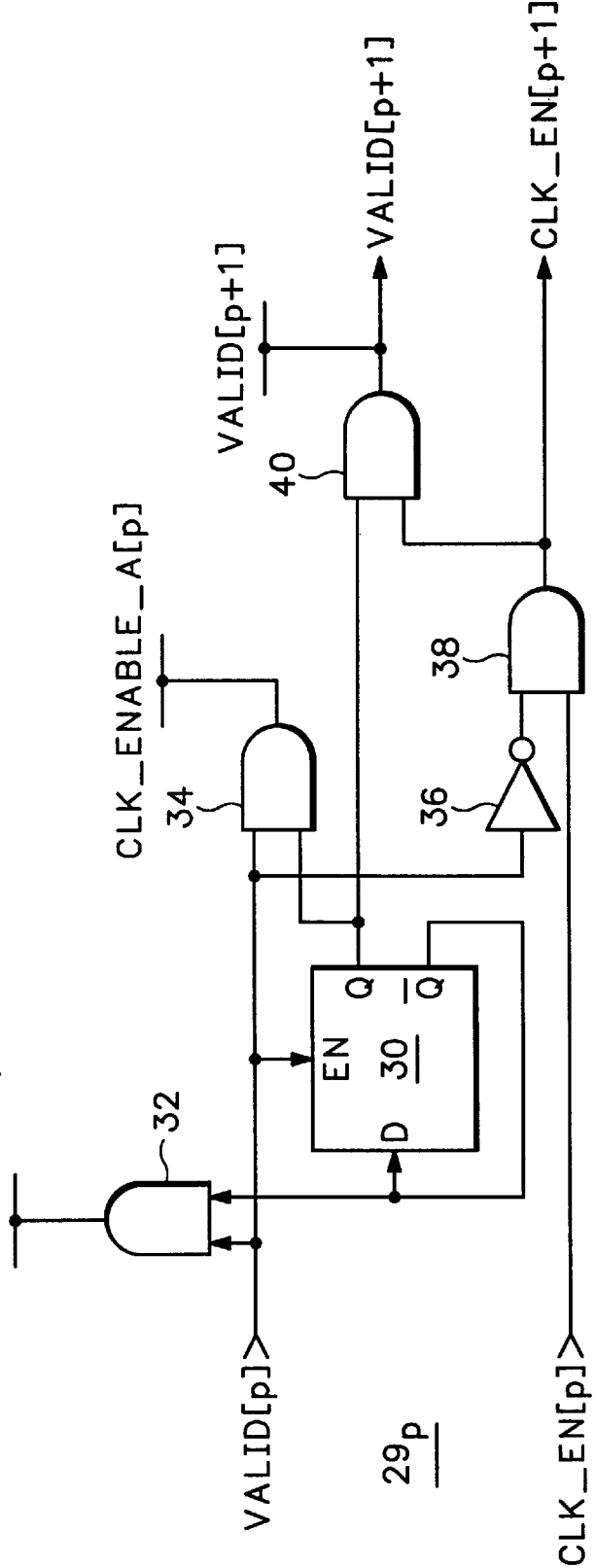
FIG. 1 is a table view illustrating timing for a FIR filter for programmable decimation by powers of two according to the present invention.

The trick is controlling the timing of such a system. To understand this conceptually a recursive argument is used by imagining filtering from the perspective of the pth decimation context, 0≦p<m. Two control signals are defined between each stage rather than a single valid signal such that:

CLK_EN[p] marks the "clock context" in which the pth stage operates, i.e., other clock edge events don't exist in its little universe VALID[p] marks the input data as valid The Table of FIG. 1 illustrates a control sequence where each column is sampled at intervals of $2^P$ clock periods in time, i.e., at every clock for p=0. "!" denotes logical inversion, and "toggle[p]" is a register for context p whose state changes as:

if CLK_EN[p] then toggle[p]←!toggle[p].

From the Table of FIG. 1 the derived outputs are identical to the inputs if the columns when CLK_EN[p+1] equals zero are ignored, so that the new pattern is identical to the old but with the enabled clock events now separated by $2^{P+1}$ clocks instead of $2^P$ for the inputs. If for the first stage, p=0, CLK_EN[0] is true on all clocks and VALID[0] is enabled at $f_s/2$ rate, and if the timing control being true for p implies that it is also true for p+1 as long as p<m, then inductively the entire system works.

For this "context switch" scheme to work, all state changes for a given context p occur when VALID[p]=1. Otherwise if additional state changes occur, there are time conflicts for different context access to register state. Also the corresponding VALID[p+1] signal output appears at a time which is not coincident with VALID[p], which requires that there is an output register OUT[p] whose input stage changes only if VALID[p]=1 and which presents the output for that context if VALID[p+1]=1. This requirement is met with a register file that has separate register write and read selection at any given clock period. All other context registers within the FIR filter share a common read and write address selection.

The FIR convolution $$V_t = \Sigma_{i=0 \to (n-1)} h_i x_{t-i} \quad (5)$$

is for an n-tap FIR filter with a sampled input sequence $x_t$ as a function of time and n filter coefficients $\{h_i\}$, $0 \leq i < n$. This sum may be separated into two sums, one over even values of i and the other for the remaining odd values:

$$V_t = \Sigma_{j=0 \to ((n+1)/2-1)} h_{2j} x_{t-2j} + \Sigma_{k=0 \to (n/2-1)} h_{2k+1} x_{t-2k-1} \quad (6)$$

where the first sum over j is for a change of variable i=2j and the second sum over k is for a change of variable i=2k+1. For decimation by two the outputs $V_t$ for either t odd or t even are discarded. Changing the variables so that t=2T for integer T produces the output for even time t as:

$$V_{2T} = \Sigma_{j=0 \to ((n+1)/2-1)} h_{2j} x_{2(T-j)} + \Sigma_{k=0 \to (n/2-1)} h_{2k+1} x_{2(T-k)-1} \quad (7)$$

where the first sum is a convolution of the even time series in $\{x\}$, (the same as the output $V_{2T}$) with the even index coefficients of $\{h\}$, and the second sum is a convolution of the odd time series in $\{x\}$ with the odd index coefficients of $\{h\}$. Therefore the first filter needs only to change its state at even time, and the second at odd time. Each FIR filter has about half of the coefficients of the original convolution (for odd n the length of the first filter is one more than the length of the second).

To implement these filters in pipelined form rather than the direct forms given above, using induction or z-transforms for an n-tap filter, the following relations define a structure with an equivalent transfer function to the basic FIR convolution equation above:

$$V_t = R[t, n-2] + h_0 x[t] \quad (8)$$

$$R[t,j] \leftarrow R[t-1, i-1] + h_{n-1-i} x[t-1] \quad (9)$$

$$R[t,i] = 0 \text{ for } i < 0 \quad (10)$$

where "←" denotes a register assignment and R[t,i] is the ith register contents at time t. Adding an additional pipeline register to the output produces:

$$OUT_t \leftarrow V_{t-1} \quad (11)$$

so that $$OUT_t = R[t, n-1]. \quad (12)$$

If $$n_1 = floor((n+1)/2) \quad (13)$$

$$n_2 = floor(n/2) \quad (14)$$

where "floor" is a function that returns the integer portion of the result, then from Equations 8, 9 and 10:

$$OUT_{2T} = R[2T, n_1 - 1] + R[2T-1, n_2 - 1] \quad (15)$$

where for t=2T, T being an integer, $$R[2T,j] \leftarrow R[2(T-1), j-1] + h_{n-1-2j} x[2(T-1)] \quad (16)$$

$$R[2T-1, k] \leftarrow R[2(T-1)-1, k-1] + h_{n-2k} x[2(T-1)-1] \quad (17)$$

These equations describe separate pipelined transversal filters, although there are now 2T delays between adjacent taps and the state of each recursion depends only upon odd and even t terms respectively. The delays may be implemented by a single register for each context p, each on alternating VALID[p] inputs, so that if at t=0 toggle[p]=0, then for the pth context the clock enables are:

$$clk\_enable\_A[p] = VALID[p] \& toggle[p] \quad (18)$$

$$clk\_enable\_B[p] = VALID[p] \& !toggle[p] \quad (19)$$

where the terms on the right are described with reference to the Table of FIG. 1.

Now the terms in 2T and 2T−1 in the above equations change on alternate VALID[p]=1 events because of the toggle[p] term, and the right-hand term for $OUT_{2T}$ is one time period t behind the left term, i.e., it has a time index one less than 2T, so the right-hand term is delayed by another register delay enabled on clk_enable_A[p], as with the left-hand term $R[2T, n_1 - 1]$, to get:

$$Z[2T] \leftarrow R[2T-1, n_2 - 1] \quad (20)$$

so that:

$$OUT_{2T} = R[2T, n_1 - 1] + Z[2T] \quad (21)$$

Finally by substitution into the above equation into the left added term and moving the add before the final enable-coincident registers $R[2T, n_1 - 1]$ and $Z[2T]$:

$$OUT_{2T} \leftarrow (R[2(T-1), n_1 - 2] + h_0 x[2(T-1)]) + R[2T-1, n_2 - 1] \quad (22)$$

where the parenthesis denotes addition precedence order as defined implicitly in the equations. For higher speed pipelining a short path from $h_0 x[2(T-1)]$ to $OUT_{2T}$ is achieved by rearranging as follows:

$$OUT_{2T} \leftarrow (R[2(T-1), n_1 - 2] + R[2T-1, n_2 - 1]) + h_0 x[2(T-1)] \quad (23)$$

Figure 2:
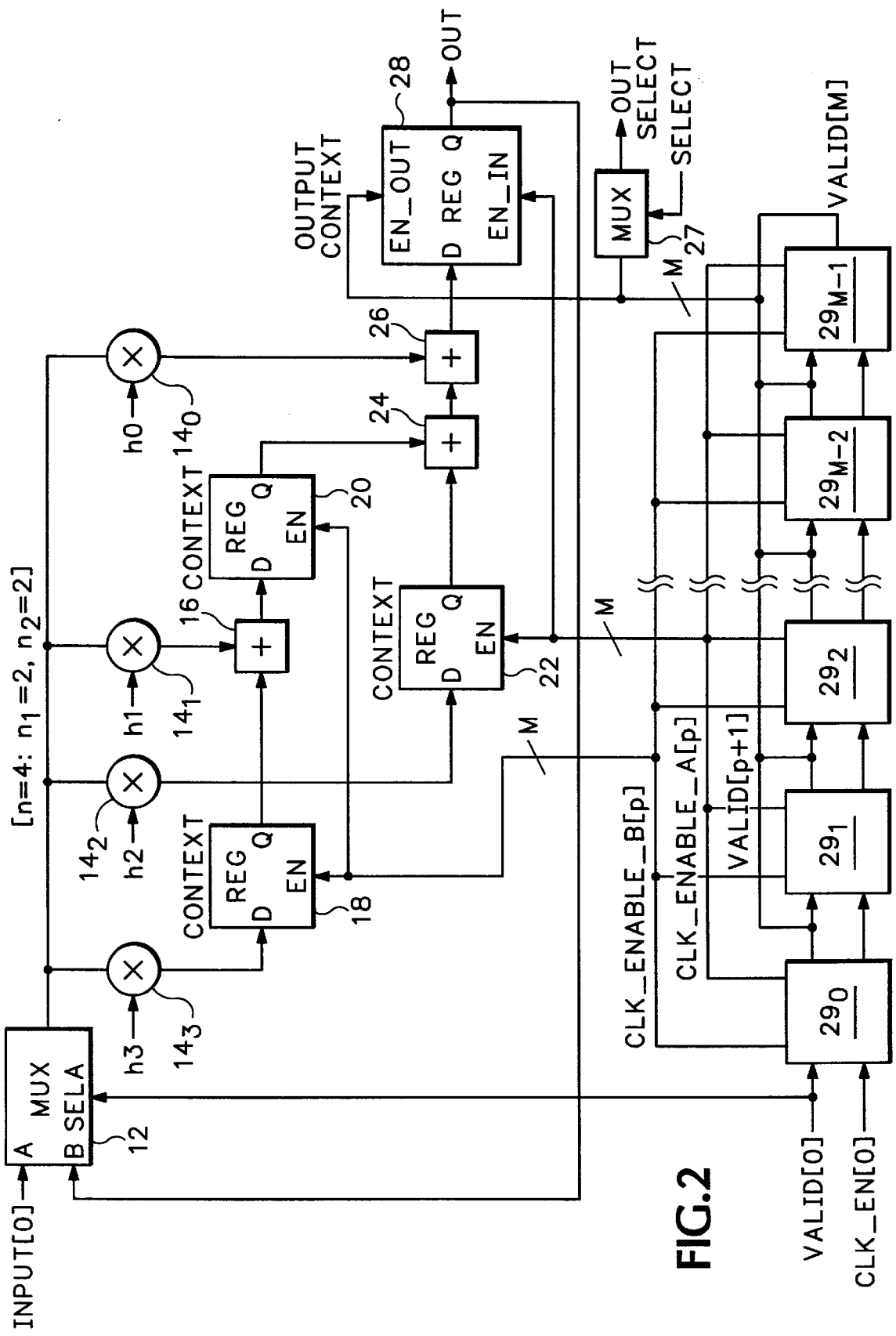
FIG. 2 is a block diagram view of a FIR filter for programmable decimation by powers of two according to the present invention.
Figure 4:
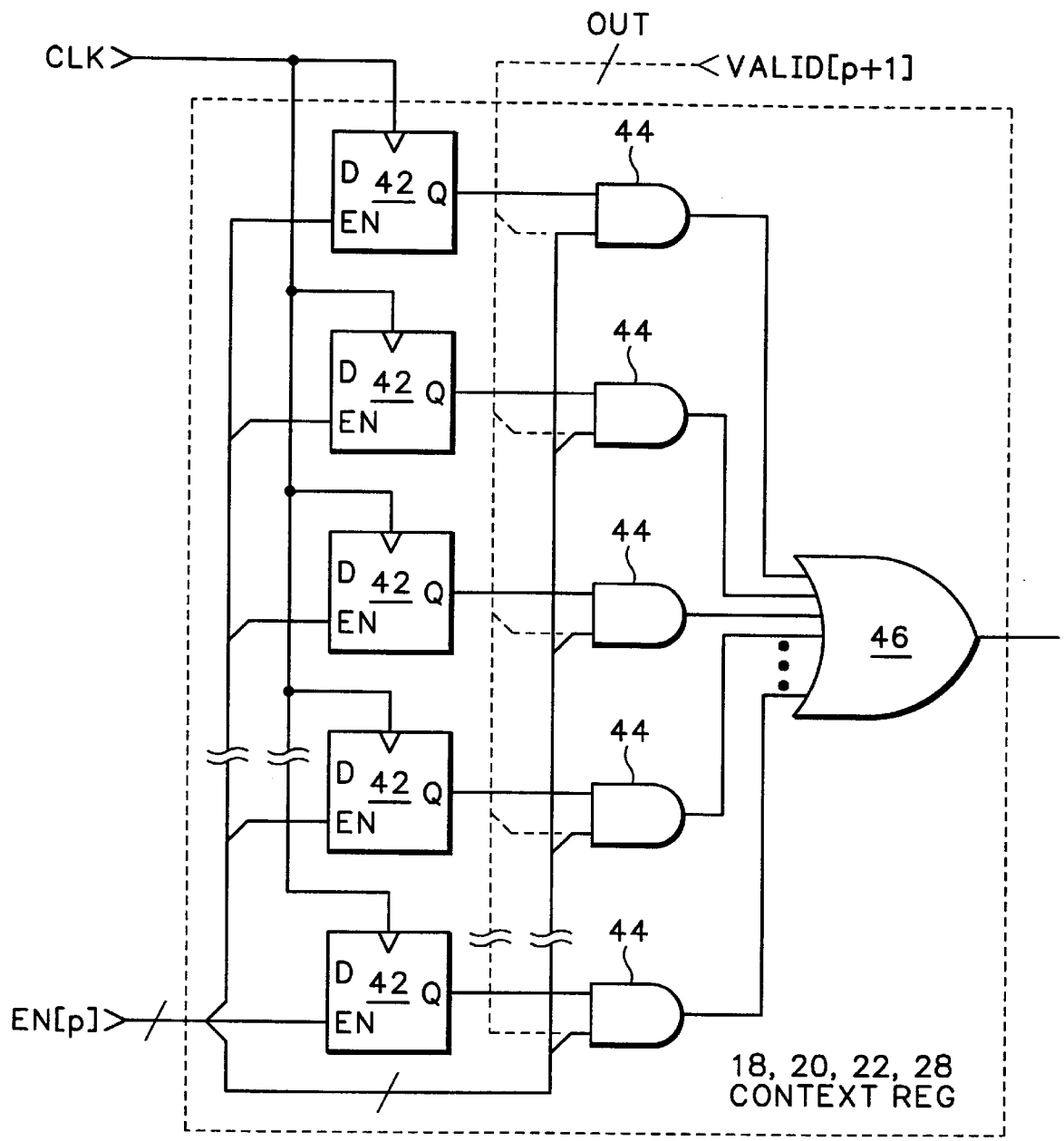
FIG. 4 a block diagram view of a representative context register for use in the FIR filter of FIG. 2.

Referring now to FIG. 2 a diagram of a four-tap final FIR filter structure based upon the above equations is shown. An input signal INPUT[0] is applied to one input of a 2 to 1 multiplexer 12, the output of which is input to a plurality of multipliers 14. Each multiplier 14 multiplies the selected output from the multiplexer 12 by a respective filter coefficient h0, h1, . . . h3. The outputs from the odd multipliers $14_1$ and $14_3$ are combined by a first adder 16 after the output from multiplier $14_3$ has been delayed by a first context register 18. The output from the first adder 16 is delayed by a second context register 20. The first and second context registers 18, 20 are enabled by a CLK_ENABLE_B[p] signal. The output from the second context register 20 provides the $R[2T-1,n_2-1]$ term of Equation 23.

The output from multiplier $14_2$ delayed by a third context register 22 provides the $R[2(T-1),n_1-2]$ term of Equation 23, which is added to the output from the second context register 20 by a second adder 24. Finally the $h_0x[2(T-1)]$ term of Equation 23 is provided by the output from multiplier $14_0$, which in turn is added to the output from the second adder 24 by a third adder 26. The output from the third adder 26 is input to an output context register 28 that has separate input and output enable ports. A CLK_ENABLE_A[p] signal enables the third context register 22 and the input enable port of the output context register 28. The output from the output context register 28 is the output signal $OUT_{2T}$ of Equation 23. The selection of the particular decimation output from the output context register 28 is determined by a multiplexer 27 which selects one of the VALID[p+1] lines to read out the desired context from the context register corresponding to a desired decimation factor $2^P$. Programmability may also be achieved in other ways, as are readily apparent to those skilled in the art.

The other inputs to the FIR filter are those necessary for timing, namely, VALID[p] and CLK_EN[p]. Timing circuits 29 are cascaded, one timing circuit for each of the m contexts. The VALID[0] signal input to the first timing circuit $29_0$ provides the select signal to the multiplexer 12 to i select the input INPUT[0]. Otherwise the output signal $OUT_{2T}$ is fed back through the multiplexer 12 for another divide by two iteration. For a given timing circuit $29_P$, as shown in FIG. 3, a toggle[p] register 30 is enabled by the VALID[p] signal, and is configured so that for every VALID [p] pulse it switches state. The input to the toggle[p] register 30 and the VALID[p] signal are combined by a first AND gate 32 to produce the CLK_ENABLE_B[p] signal occurring at one-half of the VALID[p] signal rate. The output from the toggle[p] register 30 which is of opposite phase to the input is combined with the VALID[p] signal by a second AND gate 34 to produce the CLK_ENABLE_A[p] signal. The VALID[p] signal is inverted by an inverter circuit 36 and then combined with the CLK_EN[p] signal by a third AND gate 38 to produce a CLK_EN[p+1] signal as an output to the next timing circuit $29_{p+1}$. The CLK_EN[p+1] signal is combined with the output from the toggle[p] register 30 by a fourth AND gate 40 to produce a VALID [p+1] signal as an output. The VALID[p+1] signal is out of phase with the CLK_ENABLE_A[p] signal, and is applied to the output enable port of the output context register 28 so that the register stores data and transfers out data on a non-interferring basis. The VALID[p+1] signal also is input to the next timing circuit $29_{p+1}$.

Each context register 18, 20, 22, 28 has m internal registers 42, one for each context. Each of the ENABLE[p] bus signals form an address that enables just one of the registers 42 at a time for storing data. The outputs of the registers 42 are input to respective AND gates 44 which, for context registers 18, 20, 22, are enabled also by the ENABLE[p] bus signal. The outputs from the AND gates 44 are input to an OR gate 46 that provides the selected register 42 output for that context register 18, 20, 22. For the output context register 28 the AND gates 44 are enabled by the VALID[p+1] bus, as shown by the dotted line, so that the data is stored and read out on a non-interfering basis. By appropriately selecting the desired context, or p value, for the $OUT_{2T}$, the desired decimation-by-two output is provided. Since all of the decimation by powers of two results are available in the output context register 28 at any given time, the same FIR filter output may be accessed by different end users to achieve any desired decimation by powers of two up to $\frac{1}{2}^m$.

Thus the present invention provides a FIR filter for programmable decimation by powers of two that uses context registers and just one set of multipliers and adders with cascaded timing circuits, the output of which is fed back to the input, to produce simultaneously all decimation by powers of two results up to $\frac{1}{2}^m$ from which a desired decimation result may be programmably selected.

What is claimed is:

1. An apparatus for programmable power of two decimation of an input signal comprising:

a FIR filter having a pair of inputs and an output, the input signal being applied to one of the inputs and the output providing a decimated input signal;

an output context register having an input coupled to receive the decimated input signal and having an output, the output being coupled to the other input of the FIR filter, and having m contexts of the decimated input signal stored representing all decimation by two results up to $\frac{1}{2}^m$; and means for generating timing signals having as inputs an initial valid signal and an initial clock signal, the initial valid signal having a frequency at one-half the frequency of the initial clock signal and also being input as a select signal to the FIR filter to select either the input signal or the output from the output context register for processing by the FIR filter, and having as outputs the timing signals to control decimation by the FIR filter, to clock the decimated input signal into the output context register, and to select one of the m decimated input signals at the output of the output context register having a desired decimation factor $2^P$ where $0 \leq p \leq m$.

2. The apparatus as recited in claim 1 wherein the FIR filter comprises:

an input multiplexer having the pair of inputs, having an output, and having a select input to which the initial valid signal is coupled;

a plurality of multipliers each having an input coupled to the output of the input circuit, an input coupled to receive a corresponding filter coefficient, and an output which is the product of the inputs; and means for combining the outputs of the multipliers in response to the timing signals to produce the decimated input signal at an output coupled to the input of the output context register.

3. The apparatus as recited in claim 2 wherein multipliers are divided into a set of even multipliers and a set of odd multipliers and the combining means comprises:

means for summing the set of even multiplier outputs using even context registers as delay elements to produce an even decimated input signal, each context register having m entries and being clocked by a first set of the timing signals;

means for summing the set of odd multiplier outputs using odd context registers as delay elements to produce an odd decimated input signal, each context register having m entries and being clocked by a second set of the timing signals; and means for summing the odd and even decimated input signals to provide the decimated input signal at the output of the combining means.

4. The apparatus as recited in claim 3 wherein the generating means comprises a plurality of timing circuits coupled in cascade, the first timing circuit having the initial valid signal and initial clock signal as inputs and having a valid signal and clock signal as outputs coupled to the inputs of the next timing circuit in the cascade, the output valid and clock signal frequencies of the timing circuits being one-half the frequencies of the input valid and clock signals and each timing circuit providing a pair of out-of-phase enabling signals for the even and odd context registers respectively, the pair of out-of-phase enabling signals being the first and second sets of timing signals respectively and the out-of-phase enabling signals for the odd context registers also being part of the timing signals for clocking the decimated input signals into the output context register, and the valid signals output from the timing circuits being the remainder of the timing signals for selecting the decimated input signal having the desired decimation factor for output from the output context register.

5. The apparatus as recited in claim 4 wherein each timing circuit comprises:

a toggle register having an input and a pair of outputs of opposing polarity, one of the outputs being coupled to the input of the toggle register and the outputs changing state in response to the valid signal applied to the one input of the timing circuit;

means coupled to the input of the toggle register and the valid signal input for generating one of the enabling signals and coupled to the other output of the toggle register and the valid signal input for generating the other one of the enabling signals; and means coupled to the other output of the toggle register, the valid signal input and the clock signal input for generating the valid signal output and clock output for the next timing circuit in the cascade.

* * * * *